(12) United States Patent
Yoshino

(10) Patent No.: US 7,532,004 B2
(45) Date of Patent: May 12, 2009

(54) INSPECTION DEVICE FOR INSPECTING THIN PLATE CONTAINER AND METHOD OF INSPECTING THIN PLATE CONTAINER

(75) Inventor: Katsuhiro Yoshino, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 0 days.

(21) Appl. No.: 11/730,994

(22) Filed: Apr. 5, 2007

(65) Prior Publication Data
US 2007/0286598 A1 Dec. 13, 2007

(51) Int. Cl.
*G01R 31/28* (2006.01)
*G06F 7/00* (2006.01)

(52) U.S. Cl. .............. 324/158.1; 414/935; 414/941; 700/213; 700/228

(58) Field of Classification Search .......... 250/559.01–559.49; 356/237, 238, 429, 430; 396/556; 414/935–941; 294/1.1, 86.4
See application file for complete search history.

(56) References Cited

U.S. PATENT DOCUMENTS

| | | | | |
|---|---|---|---|---|
| 5,092,729 A | * | 3/1992 | Yamazaki et al. | 414/225.01 |
| 6,591,162 B1 | * | 7/2003 | Martin | 700/228 |
| 7,105,847 B2 | * | 9/2006 | Oka | 250/559.33 |
| 2004/0052624 A1 | * | 3/2004 | Miyano et al. | 414/498 |
| 2004/0201231 A1 | * | 10/2004 | Stacey | 294/1.1 |
| 2006/0131903 A1 | * | 6/2006 | Bonora et al. | 294/1.1 |

FOREIGN PATENT DOCUMENTS

| | | |
|---|---|---|
| JP | 11-163084 | 6/1999 |
| JP | 2004-72067 | 3/2004 |

* cited by examiner

*Primary Examiner*—Georgia Y Epps
*Assistant Examiner*—Jennifer Bennett
(74) *Attorney, Agent, or Firm*—Kubotera & Associates, LLC

(57) ABSTRACT

An inspection device is used for inspecting a thin plate container having a stage guide with insulation property for supporting a thin plate one by one. The inspection device includes a conductive plate having an upper surface and a lower surface and supported on the stage guide; a shaft disposed above the upper surface or below the lower surface; and a contact member abutting against the conductive plate. The conductive plate, the shaft, and the contact member respectively have conductivity.

10 Claims, 6 Drawing Sheets

INSPECTION DEVICE FOR INSPECTING THIN PLATE CONTAINER AND METHOD OF INSPECTING THIN PLATE CONTAINER

BACKGROUND OF THE INVENTION AND RELATED ART STATEMENT

The present invention relates to an inspection device for inspecting a thin plate container and a method of inspecting a thin plate container.

A thin plate container is used for storing a plurality of thin plates such as semiconductor wafers supported on stage guides at several levels. Such a thin plate container is mainly formed of a resin. In use, the thin plate container is repeatedly washed for a long period of time. Accordingly, the thin plate container tends to deform with time.

When the thin plate container deforms, the semiconductor wafers are supported on the stage guides with irregular intervals. Accordingly, when a support plate of a transport arm is inserted into the thin plate container between the semiconductor wafers for transporting the semiconductor wafer, the support plate may hit and damage one of the semiconductor wafers. In an extreme case, when the thin plate container deforms to a large extent, the semiconductor wafer may be broken.

In order to prevent the transport arm from hitting the semiconductor wafer, the thin plate container is inspected regularly with an inspection device. When a conventional inspection device inspects the thin plate container, first, a support plate of a transport arm is inserted between the semiconductor wafers supported on the stage guides at several levels in the thin plate container. Then, an operator visually adjusts and sets an initial position where the support plate is situated between the semiconductor wafers with an equal interval.

Then, the operator adjusts heights of four cassette legs disposed on a bottom surface of the thin plate container, so that it is confirmed that the support plate does not contact with the semiconductor wafers within upper and lower limits of a variance in a supporting position of the semiconductor wafers. Afterward, the operator inspects deformation of the thin plate container (refer to Patent Reference).

Patent Reference: Japanese Patent Publication No. 2004-072067

In the conventional inspection device described above, after the operator visually confirms that the support plate is situated between the semiconductor wafers with an equal interval, the operator adjusts the heights of the cassette legs to confirm that the support plate does not contact with the semiconductor wafers within the upper and lower limits of the variance in the supporting position of the semiconductor wafers, thereby inspecting the deformation of the thin plate container. Accordingly, when the support plate is situated between the semiconductor wafers with a small interval, it is difficult to visually confirm that the support plate is situated between the semiconductor wafers with an equal interval. As a result, it is difficult to accurately set the initial position and confirm that the support plate does not contact with the semiconductor wafers within the upper and lower limits of the variance.

Further, when the operator confirms the upper and lower limits of the variance, it is necessary to adjust the cassette legs, thereby taking a long time for the inspection.

In view of the problems described above, an object of the present invention is to provide an inspection device of a thin plate container and a method of inspecting the thin plate container, in which it is possible to accurately and efficiently inspect deformation of the thin plate container.

Further objects and advantages of the invention will be apparent from the following description of the invention.

SUMMARY OF THE INVENTION

In order to attain the objects described above, according to the present invention, an inspection device is used for inspecting a thin plate container having a stage guide with insulation property for supporting a thin plate one by one. The inspection device includes a conductive plate having an upper surface and a lower surface and supported on the stage guide; a shaft disposed above the upper surface or below the lower surface; and a contact member abutting against the conductive plate. The conductive plate, the shaft, and the contact member respectively have conductivity.

In the inspection device, an electrical current is supplied to the contact member. By monitoring conductivity through contact between the conductive plate and the shaft, it is possible to easily and accurately determine deformation of the thin plate container larger than a gap between the shaft and the upper and lower surfaces of the conductive plate.

Further, it is possible to easily determine deformation of the thin plate container simply by inserting the shaft between the conductive plates. Accordingly, it is possible to efficiently inspect deformation of the thin plate container.

DETAILED DESCRIPTION OF PREFERRED EMBODIMENTS

Figure 1:
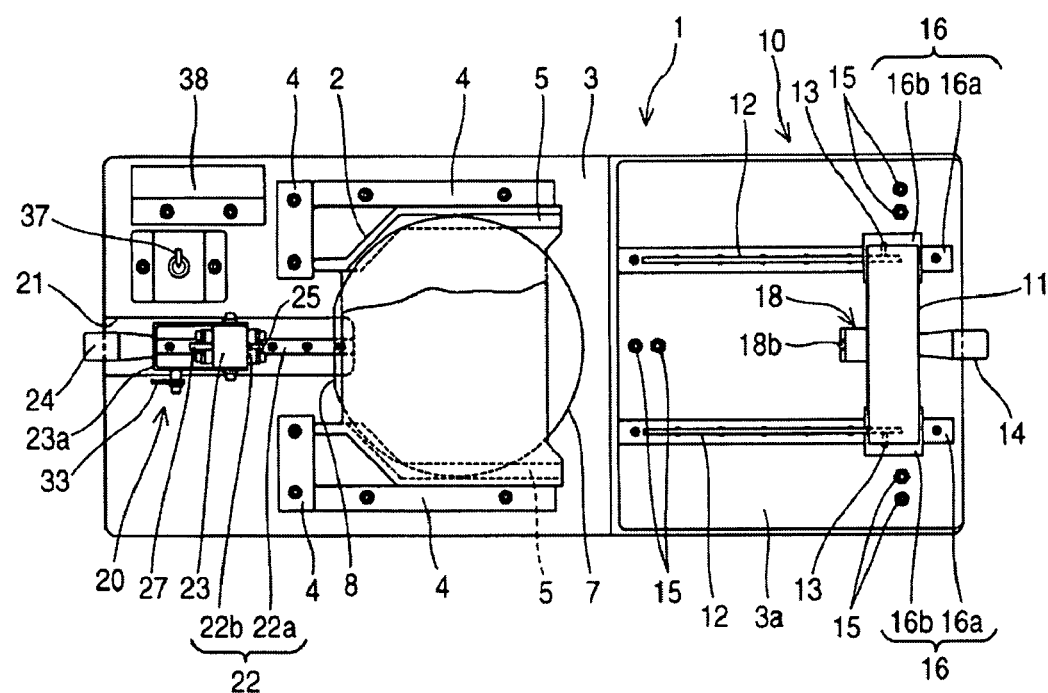
FIG. 1 is a schematic plan view showing an inspection device according to an embodiment of the present invention.

Hereunder, embodiments of the present invention will be explained with reference to the accompanying drawings. The drawings schematically show shapes, sizes, and positional relationships of constituents, and the invention is not limited to those shown in the drawings. In the drawings, a size, a shape, and an arrangement of constituting components are schematically shown for explanation of the present invention. Specific materials, conditions, and numerical conditions described in the following description are just examples. In the following description, same reference numerals denote similar components, and explanations thereof may be omitted.

Figure 2:
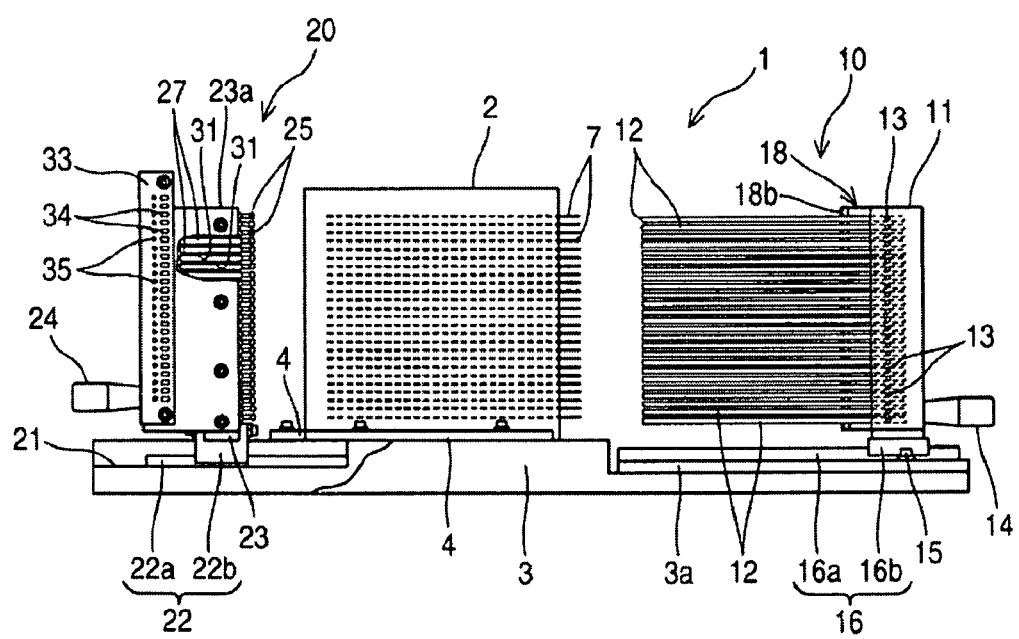
FIG. 2 is a schematic side view showing the inspection device according to the embodiment of the present invention.
Figure 3:
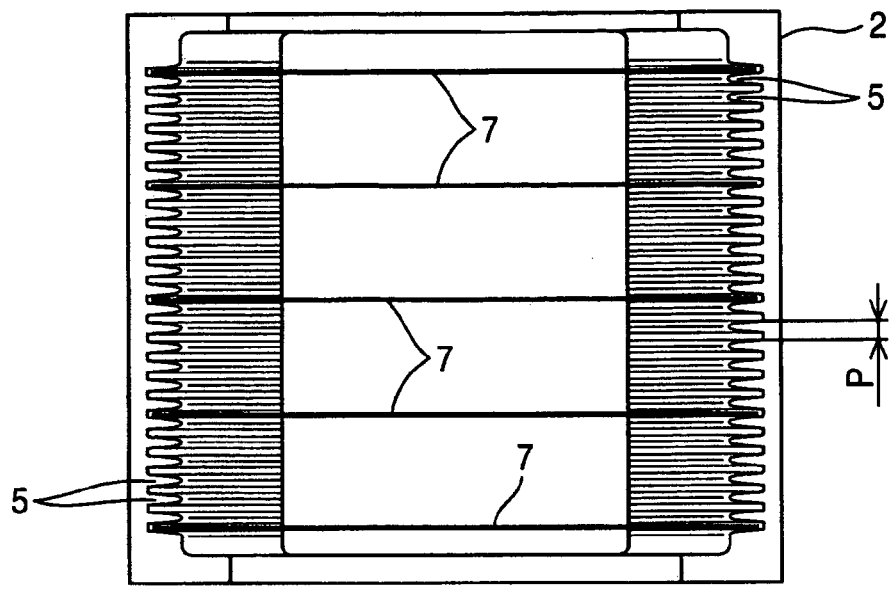
FIG. 3 is a schematic front view showing a thin plate container according to the embodiment of the present invention.
Figure 4:
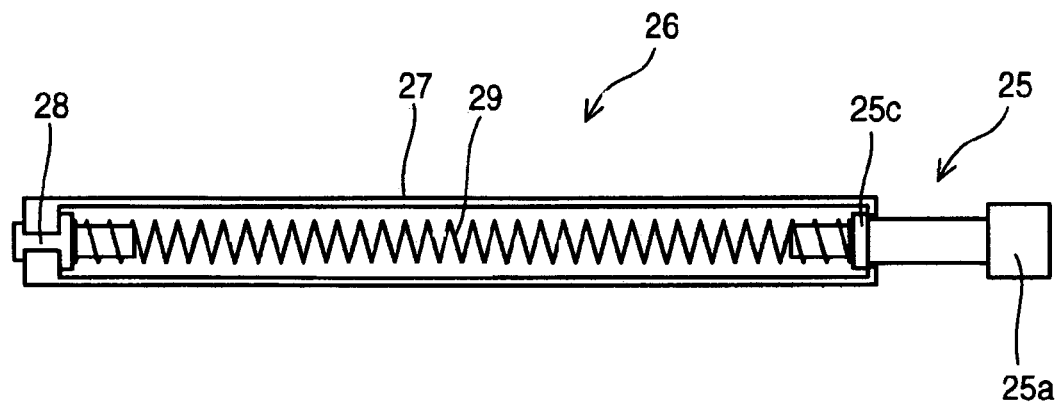
FIG. 4 is a schematic sectional view showing a contact member according to the embodiment of the present invention.

FIG. 1 is a schematic plan view showing an inspection device 1 according to an embodiment of the present invention. FIG. 2 is a schematic side view showing the inspection device 1 according to the embodiment of the present invention. FIG. 3 is a schematic front view showing a thin plate container or a wafer container 2 according to the embodiment of the present invention. FIG. 4 is a schematic sectional view showing a contact member according to the embodiment of the present invention.

Figure 5:
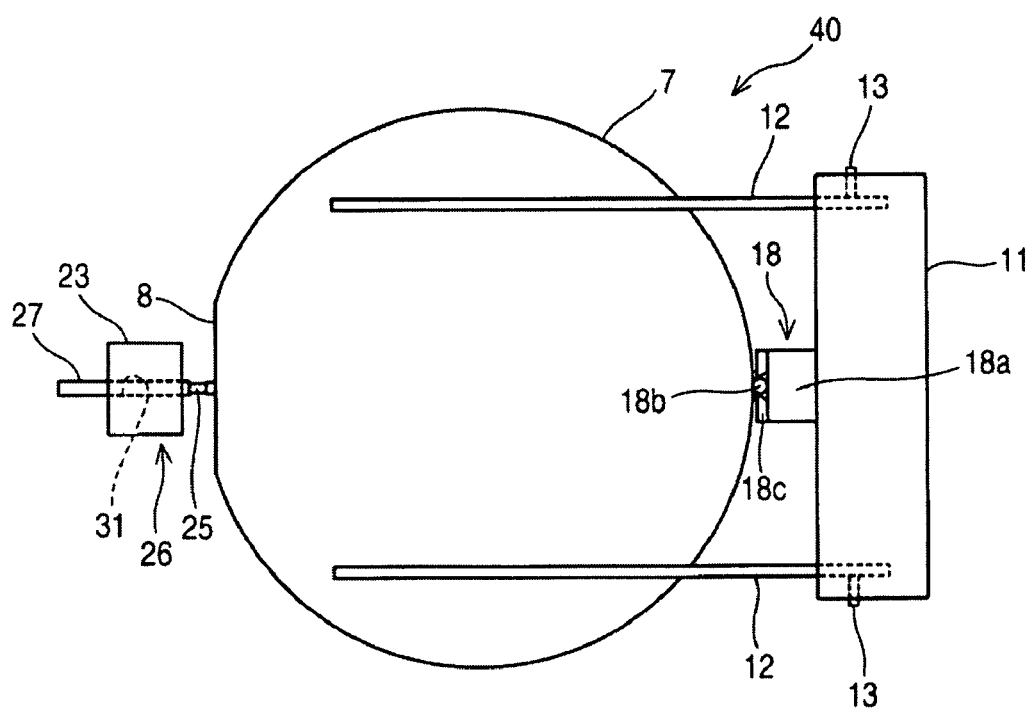
FIG. 5 is a schematic front view showing an inspection mechanism in a state of inspection according to the embodiment of the present invention.
Figure 6:
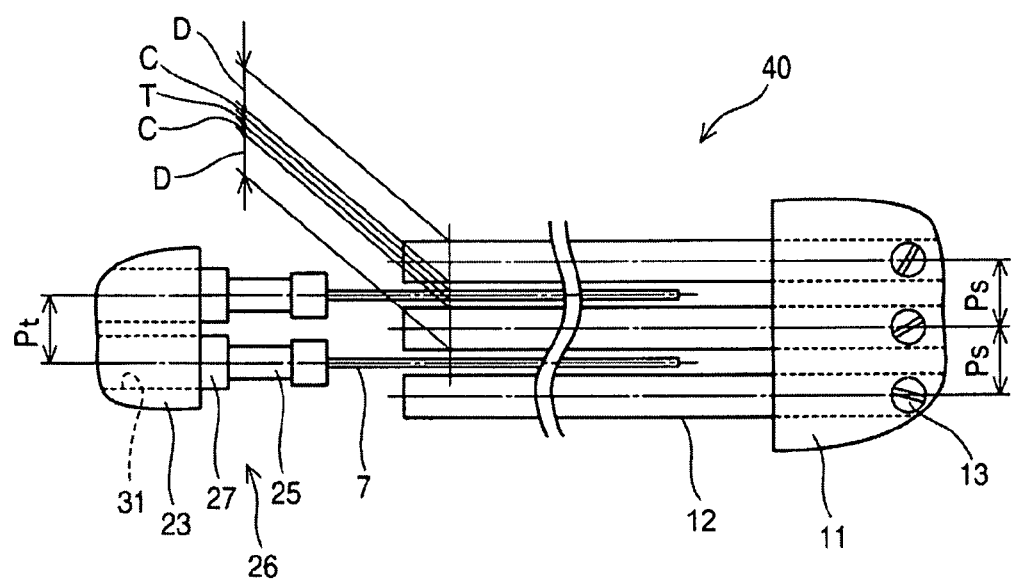
FIG. 6 is a schematic front view showing an arrangement of the inspection mechanism according to the embodiment of the present invention.
Figure 7:
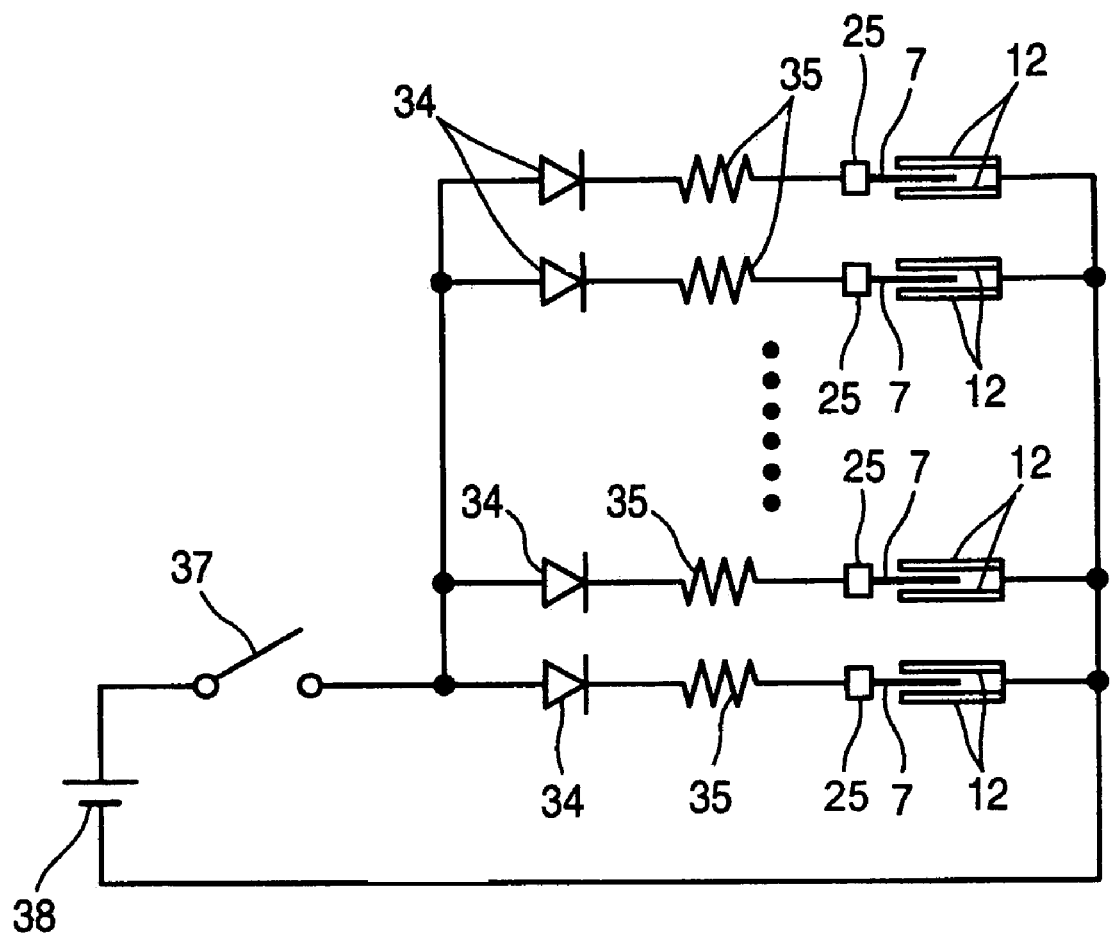
FIG. 7 is a schematic front view showing an example of a circuit of the inspection device according to the embodiment of the present invention.

Further, FIG. 5 is a schematic front view showing an inspection mechanism in a state of inspection according to the embodiment of the present invention. FIG. 6 is a schematic front view showing an arrangement of the inspection mechanism according to the embodiment of the present invention. FIG. 7 is a schematic front view showing an example of a circuit of the inspection device 1 according to the embodiment of the present invention.

In the embodiment, the inspection device 1 is used for inspecting deformation of the wafer container 2 as the thin plate container. As shown in FIGS. 1 and 2, the inspection device 1 includes a base portion 3 formed of a thick metal plate having a rectangular shape. Standard plates 4 are fixed to an upper surface of the base portion 3 at a center portion thereof with bolts and the likes in an arrangement of an L shape. The standard plates 4 are used for positioning the wafer container 2 at a setup position.

In the embodiment, the base portion 3 has a step portion for placing a contact detection unit 10 (described later) at one side thereof in a wafer insertion/pullout direction of the wafer container 2 (longitudinal direction in FIG. 2). Further, the base portion 3 has a rail installation groove 21 for receiving a current supply unit 20 (described later) at the other end thereof with the wafer container 2 inbetween.

In the embodiment, the wafer container 2 is placed at a line side of a manufacturing line of a semiconductor. When a semiconductor wafer (not shown) or a thin plate is retained in the wafer container 2, the semiconductor wafer is attached to a supporting plate of a transport arm, and is supported on each of stage guides 5. Afterward, the semiconductor is attached to the supporting plate of the transport arm again, and is taken out from the wafer container 2.

In the embodiment, the wafer container 2 is formed of a resin material with insulation property, and is configured to retain twenty-five of the semiconductor wafers (FIG. 3) having a diameter of 6.0 inch and a thickness of 0.65 mm. Each of the semiconductor wafers is supported on each of the stage guides 5 stepwise. Further, the stage guides 5 have a supporting pitch P of 4.76 mm.

In the embodiment, the inspection device 1 also includes conductive plates 7 with conductivity. Each of the conductive plates 7 is formed in a disk plate shape having a diameter and a thickness substantially same as those of the semiconductor wafers. Each of the conductive plates 7 is a disk plate made of a metal material such as copper, aluminum, iron, and the likes. Each of the conductive plates 7 may be a disk plate made of a resin material having all surfaces coated with a conductive material such as gold, copper, and the likes through vapor deposition.

In the embodiment, each of the conductive plates 7 is formed of a semiconductor substrate similar to the semiconductor wafer, and all surfaces thereof are coated with a conductive material such as gold. Further, each of the conductive plates 7 has an abutting portion 8 formed at a part of a circumference thereof as a cut portion for abutting against a contact member 25 (described later). In the inspection device 1, the contact detection unit 10 is arranged at one side of the base portion 3 relative to the wafer container 2 in the wafer insertion/pullout direction.

In the embodiment, the contact detection unit 10 has a shaft attaching plate 11 formed of a metal material with conductivity such as aluminum and the likes. Shafts 12 formed of a metal material with conductivity are fixed to both side portions of the shaft attaching plate 11 with fixing screws 13 at a pitch Ps same as the supporting pitch P of the semiconductor wafers.

Further, the shaft attaching plate 11 includes a linear guide mechanism to be able to move reciprocally with a grip 14 disposed at a surface of the shaft attaching plate 11 opposite to the wafer container 2. In the linear guide mechanism, a supplemental base 3a is fixed to the base portion 3 with adjustment screws 15. Two rails 16a are disposed in parallel on the supplemental base 3a with bolts along the wafer insertion/pullout direction of the base portion 3, and sliders 16b having a saddle shape engage the rails 16a through balls and the likes (not shown).

In the embodiment, the linear guide mechanism includes linear guide devices 16 formed of the rails 16a and the sliders 16b, in which the slider 16b is movable on the rails 16a linearly and reciprocally. The shaft attaching plate 11 is attached to the sliders 16b with bolts and the likes.

In the embodiment, a pressing member 18 is disposed on the shaft attaching plate 11 at a center portion of the surface thereof facing the wafer container 2 for pressing the conductive plates 7. The pressing member 18 includes a block 18a having a column shape and a rectangular section longer than an installation range of the shafts 12; an elastic member 18b formed of a synthetic rubber and the likes with insulation property and having a length same as that of the block 18a; and a pressing plate 18c formed of a resin material and the likes with insulation property.

In the pressing member 18, the elastic member 18b disposed on a surface of the block 18a facing the wafer container 2 is fixed with the pressing plate 18c, so that a part of a circumference of the elastic member 18b protrudes from a surface of the pressing plate 18c facing the wafer container 2 (refer to FIG. 5).

In the embodiment, a current supply unit 20 of the inspection device 1 facing the contact detection unit 10 is disposed on the base portion 3 at the other side thereof in the wafer insertion/pullout direction with the wafer container 2 inbetween. The current supply unit 20 is supported on a linear guide mechanism 22 having a rail 22a and a slider 22b. Similar to that of the contact detection unit 10, the linear guide mechanism 22 is disposed in the rail installation groove 21 disposed at a center portion of the base portion 3 in a short longitudinal direction along the wafer insertion/pullout direction. In the linear guide mechanism 22, the rail 22a is disposed on a bottom surface of the rail installation groove 21, and the slider 22b is supported on the rail 22a to be movable thereon linearly and reciprocally.

Further, a contact member attaching plate 23 is attached to the slider 22b with a bolt, and a cover 23a is attached to the contact member attaching plate 23 with a bolt. A grip 24 is attached to the cover 23a at a surface thereof opposite to the wafer container 2, so that the linear guide mechanism 22 is movable linearly and reciprocally.

As shown in FIG. 4, the contact member 25 is a shaft member with step portions formed of a metal material with conductivity such as aluminum, and is disposed at a distal end portion of a contact member assembly 26. In the contact member 25, a head portion 25a with a large diameter has an end surface to contact with the abutting portion 8 of the conductive plate 7, so that a current is supplied to the conductive plate 7.

In the embodiment, as shown in FIG. 4, the contact member assembly 26 includes a holder 27, i.e., a cylindrical member with a bottom surface formed of a resin material and the likes with insulation property. A terminal portion 28 formed of a metal material with conductivity such as cupper and the likes passes through the bottom surface.

Further, in the embodiment, the contact member assembly 26 includes a spring member 29 such as a coil spring and the like. The spring member 29 is formed of a steel wire such as spring steel and the like with conductivity, and is formed in a coil shape. The spring member 29 is disposed inside the holder 27 between a stopper portion 25c opposite to the head portion 25a of the contact members 25 having a small diameter and the terminal portion 28 disposed at the bottom surface of the holder 27. The spring member 29 urges the stopper portion 25c and the terminal portion 28 to move away from each other. Accordingly, when the contact member 25 is disposed in the holder 27, the contact member 25 can protrude from and be pushed into the holder 27.

In the embodiment, as shown in FIG. 1, a contact member attaching plate 23 is a column shape member formed of a metal material and the likes having a rectangular section. As shown in FIGS. 2 and 6, the contact member attaching plate 23 has holder engaging holes 31 passing through a surface thereof facing the wafer container 2 to the opposite surface and arranged in a row at a pitch Pt same as the supporting pitch P of the semiconductor wafers. Each of the holders 27 is fixed to one of the holder engaging holes 31 through tight fitting or adhesion, so that the contact members 25 of the contact member assemblies 26 are arranged on the side of the current supply unit 20 facing the wafer container 2.

In the embodiment, a display panel 33 is fixed to a side surface of the cover 23a of the current supply unit 20 with a bolt through a spacer. In the display panel 33, a light-emitting diode 34 is paired with a resistor 35 for adjusting a voltage thereof, and is connected to the terminal portion 28 of each of the contact member assemblies 26. During the inspection, when one of the conductive plates 7 contacts with one of the shafts 12, the light-emitting diodes 34 emits light per the conductive plate 7 for display.

In the embodiment, each of the light-emitting diodes 34 is connected to a power source 38 through a switch 37 shown in FIG. 1. The power source 38 supplies a current to each of the contact members 25 through each of the light-emitting diodes 34, each of the resistors 35, and the terminal portion 28 and the spring member 29 of each of the contact member assemblies 26. Accordingly, as shown in FIG. 7, one pair of the light-emitting diode 34 and the resistor 35 is connected to each of the contact members 25 in parallel.

As shown in FIG. 5, in an inspection mechanism 40 of the inspection device 1, it is configured such that the contact member 25 protrudes from and is pushed into the holder 27 fixed to the contact member attaching plate 23. The elastic member 18b of the pressing member 18 fixed to the shaft attaching plate 11 pushes the conductive plate 7 at one end thereof opposite to the abutting portion 8 thereof, so that the contact member 25 abuts against the abutting portion 8.

As shown in FIG. 6, the shafts 12 fixed to the shaft attaching plate 11 are situated between the conductive plates 7 with a space C. In this case, the space C between an outer circumferential surface of the shaft 12 and an upper surface and a lower surface of the conductive plate 7 is set as follows:

$$C=(L-T)/2$$

where L is a distance (allowable length) from an upper surface of the semiconductor wafer at an upper limit of an allowable positional range of the semiconductor wafer supported on the stage guide 5 of the wafer container 2 to a lower surface of the semiconductor wafer at a lower limit, and T is a thickness of the semiconductor wafer (equal to that of the conductive plate 7).

In the embodiment, the shafts 12 has a diameter D set as follows:

$$D=P-L$$

Accordingly, as shown in FIG. 6, the contact members 25 are fixed at positions same as those of the semiconductor wafer supported at the supporting pitch P in the wafer container 2 in a normal state. As described above, the contact members 25 are arranged at the pitch Pt and the shafts 12 are arranged at the pitch Ps. The pitch Pt and the pitch Ps are the same as the supporting pitch P of the semiconductor wafers. Accordingly, the shafts 12 are fixed at positions shifted from the supporting pitch P by a half of the pitch P (=P/2).

In the embodiment, the shafts 12 have a length such that, in a state of being fixed to the shaft attaching plate 11, the shafts 12 can be inserted between the conductive plates 7 up to more than three quarters of an arc of the conductive plate 7 at the position. The supporting pitch P of the wafer container 2 is set to 4.76 mm, the thickness of the semiconductor wafers is 0.65 mm, and the allowable length is set to 1.76 mm. Accordingly, the diameter D of the shafts 12 becomes 3 mm, and the space C becomes 0.56 mm.

Further, the contact members 25 are fixed at the positions shifted downward by 2.28 mm from those of the shafts 12. The contact members 25 and the shafts 12 are arranged linearly with an equal pitch of 4.76 mm.

A method of inspecting deformation of the wafer container 2 with the inspection device 1 will be explained next. In step S1, the wafer container 2 having no deformation is prepared as a standard (standard container). Five of the conductive plates 7 are inserted into the wafer container 2 from the abutting portions 8 thereof to be situated on the stage guides 5 at the lowermost level, the seventh level, the thirteenth level, the nineteenth level, and the twenty-fifth level (the uppermost level), respectively.

After the conductive plates 7 are placed on the stage guides 5, the shafts 12 are fixed to the shaft attaching plate 11 of the contact detection unit 10 at positions sandwiching the conductive plates 7 at each level. In this case, since the twenty-fifth level is the uppermost level, the shaft 12 is arranged only below the lower surface of the conducive plate 7 situated at the twenty-fifth level.

In step S2, the wafer container 2 with the conductive plates 7 retained therein is placed on the base portion 3 according to the standard plates 4 on the base portion 3. In step S3, the contact detection unit 10 is moved toward the wafer container 2 with the grip 14, so that the elastic member 18b of the pressing member 18 abuts against the outer circumferential surfaces of the conductive plates 7 and the shafts 12 are inserted between the conductive plates 7 placed at each level.

In step S4, the current supply unit 20 is moved toward the wafer container 2 with the grip 24, so that the contact members 25 contact with the abutting portions 8 of the conductive plates 7 in the inspection state shown in FIG. 5. At this moment, it is confirmed that the conductive plates 7 are sandwiched between the contact members 25 and the elastic member 18b of the pressing member 18. Further, it is confirmed that the spaces C are formed between the upper and lower surfaces of the conductive plates 7 and the outer circumferential surfaces of the shafts 12 with a thickness gauge or a guillotine gauge. In the embodiment, a space gauge is used to measure the space of 0.56 mm.

In this state, the spaces C are supposed to form between the upper and lower surfaces of the conductive plates 7 and the outer circumferential surfaces of the shafts 12. Accordingly, as shown in FIG. 7, contacts between the conductive plates 7 and the shafts 12 are disconnected, so that the light-emitting diodes 34 do not emit light. If one of the shafts 12 contacts with one of the conductive plates 7, one of the light-emitting diodes 34 emits light. Accordingly, it is possible to identify the shaft 12 corresponding to the one of the light-emitting diodes 34, thereby adjusting the position of the shaft 12 thus identified.

Through step S1 to step S4, it is confirmed that the inspection device 1 is set properly. Then, the contact detection unit 10 and the current supply unit 20 are moved back to the original positions as shown in FIG. 1, and the wafer container 2 is removed from the base portion 3.

In step S5, five of the conductive plates 7 are inserted into the wafer container 2 to be inspected from the abutting portions 8 thereof, so that the conductive plates 7 are placed on the stage guides 5 as described above. In step S6, similar to step S2, the wafer container 2 is placed on the base portion 3. In step S7, similar to step S3, the shafts 12 are inserted into the wafer container 2 to sandwich the conductive plates 7.

In step S8, similar to step S4, the end surfaces of the contact members 25 contact with the abutting portions 8 of the conductive plates 7 to confirm luminous state of the light-emitting diodes 34 of the display panel 33. When all of the light-emitting diodes 34 do not emit light, it is confirmed that deformation the wafer container 2 is within the allowable range even if small deformation exists. On the other hand, when at least one of the light-emitting diodes 34 emits light, it is determined that deformation the wafer container 2 is out the allowable range and the wafer container 2 fails the inspection while the position of the stage guide 5 corresponding to the light-emitting diode 34 thus emitting is recorded.

After step S8, the wafer container 2 placed on the base portion 3 in step S5 is removed, and another wafer container is placed to conduct the inspection from step S5. In the embodiment, the contact members 25 are arranged corresponding to the conductive plates 7. Accordingly, in step S8, it is possible to identify a position of one of the conductive plates 7 regardless of whether the shaft 12 is situated below or above the one of the conductive plates 7. When it is determined that the wafer container 2 fails the inspection, the wafer container 2 is inspected in more detail around the stage guide 5 thus identified.

As described above, in the inspection device 1 in the embodiment, after the contact members 25 contact with the conductive plates 7 supported on the stage guides 5 of the wafer container 2, the shafts 12 are arranged above and below the upper surfaces and the lower surfaces of the conductive plates 7 with the spaces C inbetween. Then, an electrical current is supplied to the contact members 25. Accordingly, by monitoring conductivity between the conductive plates 7 and the shafts 12, it is possible to easily and accurately determine deformation of the wafer container 2 larger than the spaces C without special skill.

Further, it is possible to easily determine deformation of the wafer container 2 simply by inserting the shafts 12 between the conductive plates 7. Accordingly, it is possible to efficiently inspect deformation of the wafer container 2.

In the embodiment, the space C between the outer circumferential surface of the shaft 12 and the upper surface or the lower surface of the conductive plate 7 is set to a half of the value in which the thickness T of the semiconductor wafers is subtracted from the allowable length L of the allowable positional range of the semiconductor wafers supported on the stage guides 5 of the wafer container 2. Accordingly, it is possible to determine whether deformation of the wafer container 2 exceeds the upper limit and the lower limit of the allowable range in one measurement. In this case, when the allowable length L of the allowable range becomes shorter, it is possible to deal with the change in the allowable range by increasing the diameter of the shafts 12.

In the embodiment, the contact members 25 are arranged per the conductive plates 7. When one of the conductive plates 7 contacts with one of the shafts 12, the light-emitting diodes 34 emits light per the conductive plate 7 thus contacted for display. Accordingly, it is possible to easily identify the location where deformation of the wafer container 2 is large.

In the embodiment, the conductive plates 7 formed of the silicon substrates have the surfaces coated with the conductive material. Accordingly, as compared with a case in which the conductive plates 7 are formed of metal plates, it is possible to provide the conductive plates 7 with lightweight and high rigidity. Therefore, it is possible to minimize deformation of the conductive plates 7 with own weight, thereby making it possible to accurately determine deformation of the wafer container 2.

As described above, in the inspection device 1 in the embodiment, it is possible to easily determine deformation of the wafer container 2. Accordingly, it is possible to prevent the semiconductor wafers from being damaged in advance when a transport arm conveys the semiconductor wafers.

In the embodiment, in the method of inspecting the wafer container 2, it is possible to exchange step S7 with step S8. That is, first, the contact members 25 contact with the conductive plates 7, and then the shafts 12 are inserted between the conductive plates 7, so that the conductive plates 7 are sandwiched between the contact members 25 and the elastic member 18b of the pressing member 18.

In the embodiment, the conductive plates 7 are provided with the abutting portions 8. Alternatively, the conductive plates 7 may be formed in a circular shape. With this modification, it is possible to insert the conductive plates 7 into the wafer container 2 without considering a direction of the insertion, thereby making the inspection more efficient. Further, the wafer container 2 is uniformly formed of the insulation material. However, only the stage guides 5 need to have insulation property. Accordingly, the stage guides 5 may be formed separately and attached to an inner portion of the wafer container 2.

In the method of inspecting the wafer container 2, five of the conductive plates 7 are retained in the wafer container 2 for the inspection. The number of the conductive plates 7 is not limited to five, and may be less than four or more than six. Further, the conductive plates 7 may be placed all of the stage guides 5, and all of the shafts 12 are disposed for the inspection.

As described above, in the embodiment, the inspection device 1 is provided for inspecting deformation of the wafer container 2 having the stage guides 5 with insulation property. In the inspection device 1, the shafts 12 with conductivity are arranged between the conductive plates 7 with the spaces C inbetween. Further, the contact members 25 with conductivity are provided for abutting against the conductive plates 7.

In the inspection, an electrical current is supplied to the contact members 25. Accordingly, by monitoring conductivity between the conductive plates 7 and the shafts 12, it is possible to easily and accurately determine deformation of the wafer container 2 larger than the space C, thereby making it possible to efficiently inspect deformation of the wafer container 2.

In the embodiment, when one of the conductive plates 7 contacts with one of the shafts 12, the light-emitting diodes 34 emits light per the conductive plate 7 thus contacted for display. Accordingly, it is possible to easily identify the location where deformation of the wafer container 2 is large. The display light is not limited to the light-emitting diodes 34, and may be any light emitting light through conductive contact. Further, the conductive plates 7 formed of the silicon substrates have the surfaces coated with the conductive material. Accordingly, it is possible to provide the conductive plates 7 with lightweight and high rigidity. Therefore, it is possible to minimize deformation of the conductive plates 7 with own weight, thereby making it possible to accurately determine deformation of the wafer container 2.

In the embodiment, the space C between the outer circumferential surface of the shaft 12 and the upper surface or the lower surface of the conductive plate 7 is set to a half of the value in which the thickness T of the semiconductor wafers is subtracted from the allowable length L of the allowable positional range of the semiconductor wafers supported on the stage guides 5 of the wafer container 2. Accordingly, it is possible to determine whether deformation of the wafer container 2 exceeds the upper limit and the lower limit of the allowable range in one measurement.

In the embodiment, the wafer container 2 retains the semiconductor wafers as the thin plates at multiple stages, and may include a steel plate container for retaining steel plates as thin plates in a paint process, or a panel container for retaining resin panels as thin plates in a manufacturing process of cases and the likes. The present invention is applicable for any thin plate containers as far as the container is provided with stage guides with insulation property.

Further, according to the present invention, there are provided the following methods of inspecting the thin plate container.

First, the method of inspecting a thin plate container having a stage guide for supporting a thin plate comprises the steps of: placing a conductive plate having an upper surface and a lower surface on the stage guide; arranging a shaft with conductivity above the upper surface or below the lower surface with a space therebetween; and contacting a contact member with conductivity with the conductive plate.

Second, the method of inspecting the thin plate container described above further comprises the step of: identifying the conductive plate contacting with the shaft by monitoring a display light arranged to emit light when the conductive plate contacts with the shaft.

The disclosure of Japanese Patent Application No. 2006-158899, filed on Jun. 7, 2006, is incorporated in the application by reference.

While the invention has been explained with reference to the specific embodiments of the invention, the explanation is illustrative and the invention is limited only by the appended claims.

What is claimed is:

1. An inspection device for inspecting a thin plate container having a stage guide for supporting a thin plate, comprising:
    a plurality of conductive plates each having an upper surface and a lower surface and to be supported on the stage guide;
    a plurality of shafts to be disposed between the conductive plates above the upper surface and below the lower surface, said shafts and having conductivity;
    a plurality of contact members abutting against the conductive plates and having conductivity; and
    a power source having a first end portion electrically connected to the contact members and a second end portion electrically connected to each of the shafts through a diode so that an electrical current flows between one of the contact members and corresponding one of the shafts when the corresponding one of the shafts contacts with one of the conductive plates.

2. The inspection device according to claim 1, further comprising a display light for identifying the one of the conductive plates when the corresponding one of the shafts contacts with the one of the conductive plates.

3. The inspection device according to claim 1, wherein each of said conductive plates is formed of a silicon substrate having a surface coated with a conductive material.

4. The inspection device according to claim 1, wherein each of said shafts is arranged so that a space between an outer circumferential surface of the shaft and the upper surface or the lower surface of each of the conductive plates becomes a half of a value in which a thickness of the thin plate is subtracted from an allowable length of an allowable positional range of the thin plate.

5. A method of inspecting a thin plate container having a stage guide for supporting a thin plate, comprising the steps of:
    placing a plurality of conductive plates each having an upper surface and a lower surface on the stage guide;
    arranging a plurality of shafts with conductivity between the conductive plates above the upper surface and below the lower surface with a space therebetween;
    contacting a plurality of contact members with conductivity with the conductive plates; and
    connecting a first end portion of a power supply to the contact members and a second end portion of the power supply to each of the shafts through a diode so that an electrical current flows between one of the contact members and corresponding one of the shafts when the corresponding one of the shafts contacts with one of the conductive plates.

6. The method of inspecting the thin plate container according to claim 5, further comprising the step of:
    identifying the one of the conductive plates contacting with the corresponding one of the shafts by monitoring a display light arranged to emit light when the one of the conductive plates contacts with the corresponding one of the shafts.

7. An inspection device for inspecting a thin plate container having a stage guide for supporting a thin plate, comprising:
    a conductive plate having an upper surface and a lower surface and to be supported on the stage guide;
    a shaft to be disposed above the upper surface or below the lower surface and having conductivity;
    a contact member abutting against the conductive plate and having conductivity;
    a power source having a first end portion electrically connected to the contact member and a second end portion electrically connected to the shaft so that an electrical current flows between the contact member and the shaft when the shaft contacts with the conductive plate;
    a base portion for placing the thin plate container;
    a shaft attaching plate disposed on the base portion for supporting the shaft;

a current supply unit disposed on the base portion for retaining the power source, said shaft attaching plate being situated on one side of the thin plate container so that the shaft is inserted into the thin plate container from the one side, said current supply unit being situated on an opposite side of the thin plate container so that the contact member contacts with the conductive plate from the opposite side; and at least one of a linear guide mechanism and a linear guide device disposed on the base portion for linearly guiding the shaft attaching plate.

8. The inspection device according to claim 7, further comprising a display light for identifying the conductive plate when the shaft contacts with the conductive plate.

9. The inspection device according to claim 7, wherein said conductive plate is formed of a silicon substrate having a surface coated with a conductive material.

10. The inspection device according to claim 7, wherein said shaft is arranged so that a space between an outer circumferential surface of the shaft and the upper surface or the lower surface of the conductive plate becomes a half of a value in which a thickness of the thin plate is subtracted from an allowable length of an allowable positional range of the thin plate.

* * * * *